(12) United States Patent
Bulgajewski et al.

(10) Patent No.: US 10,601,148 B2
(45) Date of Patent: Mar. 24, 2020

(54) HIGH WATTAGE SOLDERLESS FLEXIBLE CONNECTOR FOR PRINTED CONDUCTORS

(71) Applicant: ILLINOIS TOOL WORKS INC., Glenview, IL (US)

(72) Inventors: Edward F. Bulgajewski, Genoa, IL (US); Piotr Sliwa, Mount Prospect, IL (US); John F. Healey, Naperville, IL (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 16/167,832

(22) Filed: Oct. 23, 2018

(65) Prior Publication Data
US 2019/0123457 A1    Apr. 25, 2019

Related U.S. Application Data

(60) Provisional application No. 62/575,758, filed on Oct. 23, 2017.

(51) Int. Cl.
| | |
|---|---|
| *H01R 4/04* | (2006.01) |
| *H05K 3/32* | (2006.01) |
| *H05K 1/02* | (2006.01) |
| *H05B 3/84* | (2006.01) |
| *H05K 3/30* | (2006.01) |
| *H01R 4/06* | (2006.01) |

(52) U.S. Cl.
CPC .............. *H01R 4/04* (2013.01); *H05B 3/84* (2013.01); *H05K 1/0209* (2013.01); *H05K 1/0212* (2013.01); *H05K 3/305* (2013.01); *H05K 3/323* (2013.01); *H01R 4/06* (2013.01); *H05B 2203/016* (2013.01); *H05B 2203/031* (2013.01)

(58) Field of Classification Search
CPC .......... H01R 4/04; H05B 3/84; H05K 1/0209; H05K 1/0212
USPC ................... 439/371, 34, 78, 83, 876
See application file for complete search history.

(56) References Cited

U.S. PATENT DOCUMENTS 2,709,211 A * 5/1955 Glynn ...................... H01C 1/14
                                                           338/308
4,023,008 A * 5/1977 Durussel .................. H05B 3/84
                                                           219/522

(Continued)

OTHER PUBLICATIONS

International Search Report and Written Opinion of the International Searching Authority for PCT/US2018/057055, dated Feb. 12, 2019.

*Primary Examiner* — Tulsidas C Patel
*Assistant Examiner* — Peter G Leigh
(74) *Attorney, Agent, or Firm* — Quarles & Brady LLP

(57) ABSTRACT

An adhesive connector for making an electrical connection to a conductor formed on a support surface is provided. The adhesive connector includes a substrate and a metal strip attached to a first surface of the substrate, wherein the metal strip is configured to engage a releasable electrical connector. The adhesive connector also includes a conductive strip attached to a second surface of the substrate and a conductive staple configured to secure the conductive strip, the substrate, and the metal strip together. The adhesive connector further includes an electrically-conducting adhesive that coats a first portion of the conductive strip, and is configured to provide electrical contact to a conductor formed on a support surface.

19 Claims, 3 Drawing Sheets

(56) References Cited

U.S. PATENT DOCUMENTS

| | | | | |
|---|---|---|---|---|
| 4,415,196 A * | 11/1983 | Baum | ............... | B60J 1/1884 15/250.3 |
| 4,628,187 A * | 12/1986 | Sekiguchi | ............ | B60R 1/0602 219/505 |
| 4,931,627 A * | 6/1990 | Watts | ............... | H05B 3/146 219/203 |
| 4,977,309 A * | 12/1990 | Uchida | ............... | H01C 1/028 219/541 |
| 5,307,076 A * | 4/1994 | Murakami | ....... | B32B 17/10036 343/704 |
| 5,716,536 A * | 2/1998 | Yokoto | ............... | H05B 3/84 15/250.003 |
| 5,760,744 A * | 6/1998 | Sauer | ............... | B32B 17/10036 29/600 |
| 5,793,276 A * | 8/1998 | Tosaka | ............... | H01C 7/027 338/22 R |
| 6,103,998 A * | 8/2000 | Kuno | ............... | B29C 45/14344 219/203 |
| 6,164,984 A * | 12/2000 | Schreiner | ............ | H01Q 1/1271 439/86 |
| 6,426,485 B1 * | 7/2002 | Bulgajewski | ......... | H05B 3/845 219/219 |
| 6,476,358 B1 * | 11/2002 | Lang | ............... | B60Q 1/2665 219/203 |
| 6,730,848 B1 * | 5/2004 | Antaya | ............... | B23K 1/0008 174/78 |
| 6,774,342 B2 * | 8/2004 | Capriotti | ............... | H05B 3/84 219/203 |
| 6,790,104 B2 * | 9/2004 | Antaya | ............... | H01R 13/04 439/83 |
| 6,840,780 B1 * | 1/2005 | Antaya | ............... | H01R 4/04 343/713 |
| 7,059,884 B2 * | 6/2006 | Hisaeda | ............... | H01R 13/20 439/329 |
| 7,270,548 B2 * | 9/2007 | Jenrich | ............... | H01R 11/16 439/34 |
| 7,663,561 B2 * | 2/2010 | Hisaeda | ............ | B32B 17/10036 343/713 |
| 8,299,400 B2 * | 10/2012 | Prone | ............... | B32B 17/10036 219/203 |
| 9,504,174 B2 * | 11/2016 | Mai-Krist | ............... | H05B 3/08 |
| 9,509,088 B2 * | 11/2016 | Timmermann | .... | H01R 12/7041 |
| 9,598,053 B2 * | 3/2017 | Caillot | ............... | B60S 1/3805 |
| 2003/0162415 A1 * | 8/2003 | Spaulding | ............... | B60J 1/02 439/34 |
| 2003/0180545 A1 | 9/2003 | Capriotti et al. | | |
| 2006/0105589 A1 * | 5/2006 | Ackerman | ......... | H01R 43/0207 439/34 |
| 2007/0105412 A1 * | 5/2007 | Hoepfner | ............... | C22C 1/002 439/83 |
| 2007/0224842 A1 * | 9/2007 | Hoepfner | ............... | H01R 4/02 439/34 |
| 2009/0070952 A1 * | 3/2009 | Peng | ............... | B60S 1/3805 15/250.06 |
| 2011/0109115 A1 * | 5/2011 | Yamada | ............... | H01R 11/01 296/84.1 |
| 2012/0117880 A1 * | 5/2012 | Lahnala | ............... | B60J 1/1853 49/70 |
| 2013/0183838 A1 * | 7/2013 | Caillot | ............... | B60S 1/3805 439/34 |
| 2015/0155646 A1 * | 6/2015 | Takeuchi | ............... | H01R 4/04 439/78 |
| 2016/0381734 A1 * | 12/2016 | Briggs | ............... | G01K 13/00 219/522 |

\* cited by examiner

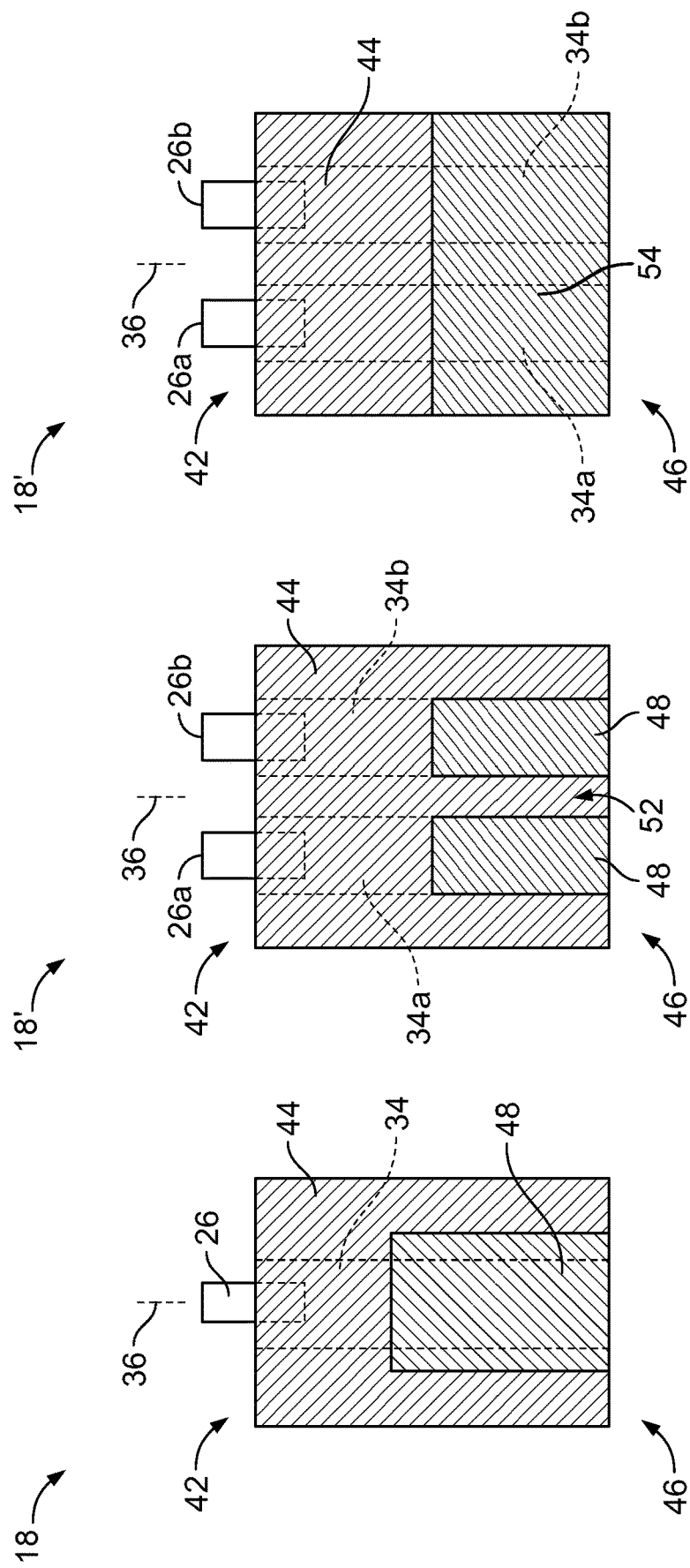

HIGH WATTAGE SOLDERLESS FLEXIBLE CONNECTOR FOR PRINTED CONDUCTORS

CROSS-REFERENCE TO RELATED APPLICATIONS

The present application is based on, claims priority to, and incorporates in its entirety U.S. Provisional Application No. 62/575,758, filed on Oct. 23, 2017, and entitled "High Wattage Solderless Flex Connector for Glass Heater."

FIELD OF THE INVENTION

The present invention relates to printed conductors, such as heaters for automotive windshields and the like, and in particular to an electrical connector for connecting to such printed conductors.

BACKGROUND

Automotive manufacturers commonly employ a variety of thin conductive materials, including electrical heaters, in the manufacture of vehicles. Such electrical heaters may take the form of rear window defrosters, windshield wiper park position heaters, mirror heaters, and sensor heaters, the latter used, for example, for sensor windows of autonomous vehicle control systems. Such heaters may be constructed by printing a conductive material directly on glass by, for example, using a silver-impregnated ink. The ink is then cured on the glass in an oven.

The printed heater conductors must be connected to the automotive electrical system, which is typically accomplished through a wiring harness conductor. In the simplest approach, a metal terminal is soldered onto the printed conductor. The metal terminal may be attached to a releasable electrical connector that communicates with a flexible wire of the automotive wiring harness and conducts current from the automotive electrical system through the printed heater material to heat the glass surface by resistive heating. However, the process of soldering a metal terminal to the printed conductor requires high temperatures, which can cause microcracks in the glass surface supporting the printed conductor and later lead to glass failure.

Therefore, there is a continued need for making an electrical connection to a printed conductor on a glass surface, such as a printed heater material, without soldering a metal terminal directly to the printed conductor.

SUMMARY

In one aspect, an adhesive connector for making an electrical connection to a conductor formed on a support surface is provided. The adhesive connector includes a substrate and a metal strip attached to a first surface of the substrate, wherein the metal strip is configured to engage a releasable electrical connector. The adhesive connector also includes a conductive strip attached to a second surface of the substrate and a conductive staple configured to secure the conductive strip, the substrate, and the metal strip together. The adhesive connector further includes an electrically-conducting adhesive that coats a first portion of the conductive strip, and is configured to provide electrical contact to a conductor formed on a support surface.

In another aspect, an adhesive connector for making an electrical connection to a printed conductor formed on a glass surface is provided. The adhesive connector includes a flexible substrate configured to conform to a glass surface and a metal strip attached to a first surface of the flexible substrate, wherein the metal strip is configured to engage a releasable electrical connector. The adhesive connector also includes a conductive strip attached to a second surface of the flexible substrate and a conductive staple configured to secure the conductive strip, the flexible substrate, and the metal strip together. The adhesive connector further includes an electrically-conducting adhesive that coats a first portion of the conductive strip, and is configured to provide electrical contact to a printed conductor formed on the glass surface.

Other features and advantages of the invention will become apparent to those skilled in the art upon review of the following detailed description, claims and drawings in which like numerals are used to designate like features.

BRIEF DESCRIPTION OF THE DRAWINGS

The invention will be better understood and features, aspects and advantages other than those set forth above will become apparent when consideration is given to the following detailed description thereof. Such detailed description makes reference to the following drawings.

FIG. 4 is a bottom plan view of an alternative adhesive layout for the adhesive connector of FIG. 2;

FIG. 5 is a bottom plan view of an adhesive connector similar to that of FIG. 4 showing an adhesive connector configured to join with two separate printed conductors using separated regions of conductive adhesive; and FIG. 6 is a figure similar to that of FIG. 5 showing the use of an anisotropically conductive adhesive that provides electrical conduction only perpendicularly to a broad surface of the adhesive connector.

DETAILED DESCRIPTION

Figure 1:
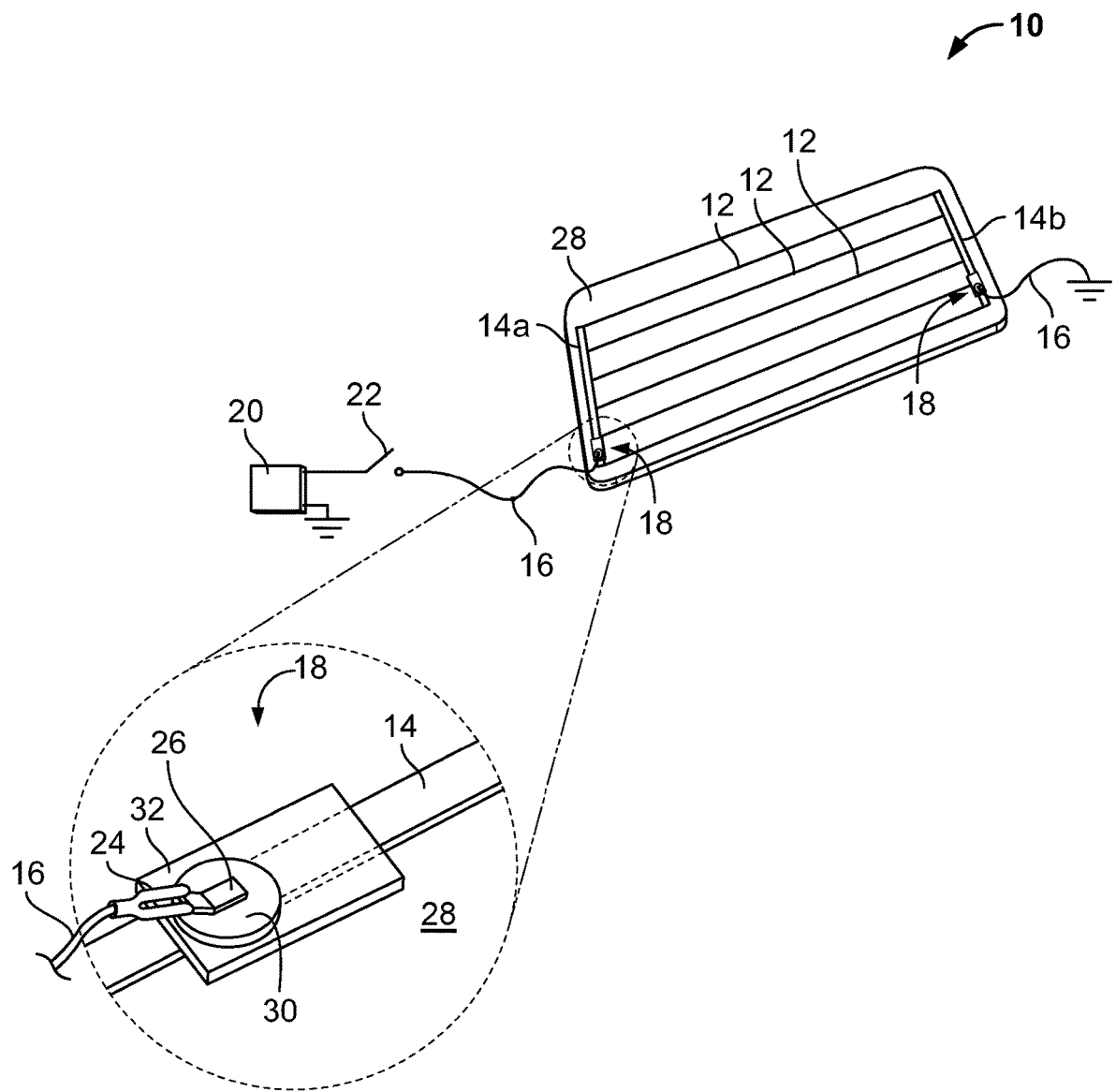
FIG. 1 is a perspective view of a defroster heater on a glass surface of a window, the defroster heater having printed conductors joined to a harness wiring using an adhesive connector, in accordance with aspects of the present disclosure.

Referring now to FIG. 1, a rear window 10 in a vehicle, or the like, may have multiple parallel printed conductors 12 that are spaced-apart and extend laterally between printed bus conductors 14a, 14b. In the present embodiment, the bus conductors 14a, 14b comprise two conductors that extend vertically alongside edges of the window 10. In a particular aspect of the present disclosure, the bus conductors 14a, 14b are perpendicular or generally perpendicular to the printed conductors 12. However, it is also contemplated that a fewer or greater number of discrete and separate bus conductors (generally referred to as 14) may be utilized, it being further contemplated that opposing pairs of conductors may be the more desirable implementation. The bus conductors 14 will typically be wider than the parallel printed conductors 12, reflecting their greater current-carrying role and the desire to keep the parallel printed conductors 12 narrow for reasons of improved visibility through the window 10. The printed conductors 12 and bus conductors 14 may be applied to an inner surface of the rear window 10, for example, by silk-screening a silver impregnated polymer material in the desired pattern and then heating this printed layer to provide an electrically continuous conductor along the printed pathways.

The bus conductors 14a, 14b may electrically communicate with one or more wires 16 (e.g. wire(s) of an automotive wire harness) by means of adhesive connectors 18 joining the wires 16 to the bus conductors 14a, 14b. In this way, a positive voltage may be applied to one bus conductor 14a, for example, by an automotive electrical system 20, while a ground voltage may be applied through a second adhesive connector 18 communicating with the bus conductor 14b. The automotive electrical system 20 may include, for example, a battery and alternator. The battery and alternator may be electrically connected through a switch 22 to provide a nominal 12-volt power across the bus conductors 14a, 14b, and as much as 20 to 30 amperes of current through the printed conductors 12. The current may be divided in parallel among the printed conductors 12 to provide up to, and in excess of 100 Watts of heating power.

Referring still to FIG. 1, each adhesive connector 18 may be applied over the printed conductive material of a bus conductor 14 to sandwich the printed conductive material of the bus conductor 14 between a glass surface 28 of the window 10 and the adhesive connector 18. The adhesive connector 18 supports at one end, on its upper (outer) exposed surface, a releasable electrical connector 24 communicating electrically with one of the wires 16. In some embodiments, the releasable electrical connector 24 may be releasably coupled to a metal strip 26.

Figure 2:
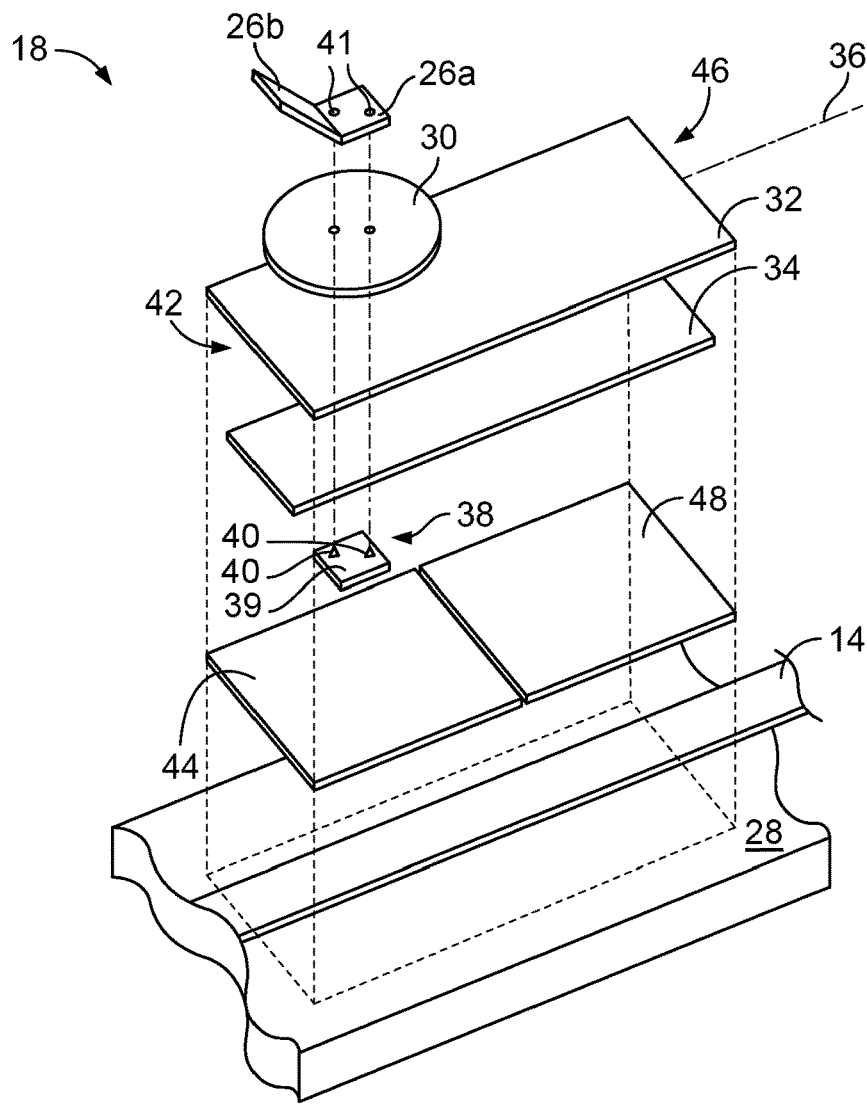
FIG. 2 is an exploded diagrammatic view of the various layers of the adhesive connector of FIG. 1.

With reference to FIGS. 1 and 2, the metal strip 26 may include a first portion 26a attached to the adhesive connector 18 and configured to lie coplanar along its upper surface, and a second portion 26b canted to extend upward from the upper surface, as a projecting rectangular tab, for example. The second portion 26b of the metal strip 26 is configured to engage the releasable electrical connector 24 and make an electrical communication between the wire 16 and the metal strip 26. As an example, the releasable electrical connector 24 in FIG. 1 is shown as a quick-disconnect terminal. However, it may be appreciated that a variety of terminal types or connectors may be used for the releasable electrical connector 24. As such, the metal strip 26, and more particularly the second portion 26b of the metal strip 26, may be adapted to engage such terminal types or connectors.

The proximal end 42 of the metal strip 26 may be affixed to the adhesive connector 18 over the top of a heat sink 30. The present embodiment utilizes a soft aluminum for the heat sink 30; however, it is contemplated that any number of materials may be used. The heat sink 30 is an optional component, which is provided to dissipate heat generated by current flowing through the junction between the metal strip 26 and a conductive material on the lower surface of the adhesive connector 18, e.g., the bus conductor 14 forming a heater on the glass surface 28. Although the heat sink 30 is shown as a circular disk, it may be appreciated that the heat sink 30 may have non-circular geometries, including rectangular, square, and oval geometries.

Figure 3:
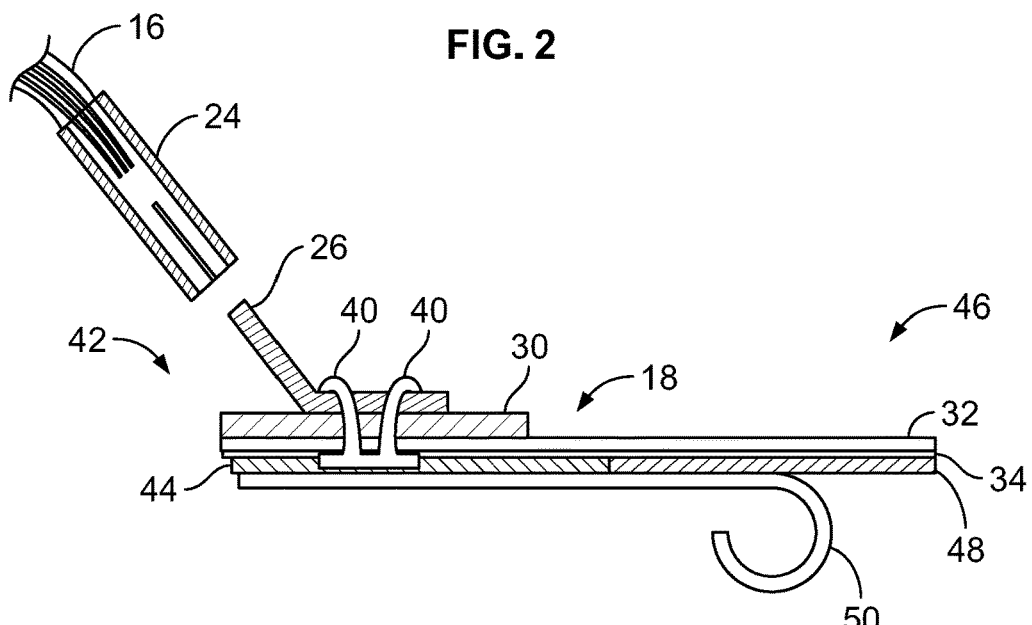
FIG. 3 is a cross-sectional view through a midline of the adhesive connector of FIGS. 1 and 2 prior to attachment to the printed conductors.

Referring now to FIGS. 2 and 3, the adhesive connector 18 may include a substrate 32, which may be formed from a flexible polymer, e.g., a flexible polyester film. A conductive strip 34 may be attached to the under surface of the substrate 32. In the present embodiment, the conductive strip 34 may be constructed using laminated foil or silkscreen printed conductive ink, e.g., similar to the bus conductors 14. The conductive strip 34 generally lies along a midline 36 of the substrate's 32 long dimension, and extends the full length of the substrate 32. In some embodiments, the width of the conductive strip 34 may be at least as wide as the width of the bus conductive strip 14, and preferably wider by a margin of 10 to 20 percent, or more, to allow for some misalignment during the manufacturing or construction process.

A conductive staple 38, having a flat head 39 with upwardly extending prongs 40, may be positioned so that the flat head 39 abuts and electrically communicates with a lower surface of the conductive strip 34. In this configuration, the prongs 40 extend upward through the conductive strip 34, the substrate 32, and heat sink 30, for receipt within holes 41 formed in the metal strip 26. In the present embodiment, the two holes 41 are provided for communication with two prongs 40. However, it is also envisioned that a fewer or greater number of prongs 40 and holes 41 may be utilized. The prongs 40 are configured to engage the metal strip 26 to fasten the heat sink 30, the substrate 32, and the conductive strip 34 together, and form a gas-tight or low resistance electrical connection between the metal strip 26 and the conductive staple 38. In this manner, an electrical communication may be formed between the metal strip 26 and the conductive strip 34. The portions of the prongs 40 that extend through the holes 41 in the metal strip 26 may be peened over, soldered, brazed, or spot welded to the metal strip 26 to physically attach the two together, or may simply rely on an interference or press fit. In some aspects, several factors may dictate the method of attaching the prongs 40 to the metal strip 26, including the electrical connection required between the metal strip 26 and the conductive staple 38, the power dissipation or electrical current running therethrough, as well as material or geometrical properties of the adhesive connector 18, bus conductors 14a and 14b, and the glass surface 28.

A proximal end 42 of the adhesive connector 18, which corresponds to a region generally beneath the metal strip 26, may be coated with an electrically-insulating adhesive 44, e.g. an electrically-insulating, pressure-sensitive adhesive. The electrically-insulating adhesive 44 covers the conductive staple 38 piercing through the conductive strip 34, and a portion of the conductive strip's 34 under surface. A distal end 46 of the adhesive connector 18 may conversely be coated with an electrically-conductive adhesive 48, e.g., an electrically conductive, pressure-sensitive adhesive. The electrically-conductive adhesive 48 covers the other portion of the conductive strip's 34 under surface. When the adhesive connector 18 is placed in contact with the bus conductor 14 and the glass surface 28, an electrical contact is established with the bus conductor 14, and thus a conductive pathway is formed between the bus conductor 14 and metal strip 26 via the electrically-conductive adhesive 48, the conductive strip 34, and the conductive staple 38, respectively. The ability to use an electrically-insulating adhesive 48 allows for the optimization of adhesion beneath the metal strip 26 and provides mechanical strain relief for tension placed on the wire 16 leading to the releasable connector 26.

As shown in FIG. 3, the lower surfaces of the electrically-conductive adhesive 48 and electrically-insulating adhesive 44 may be covered with a release liner 50, e.g. a siliconized release liner, prior to installation. The release liner 50 may then be peeled away and the adhesive connector 18 applied to the bus conductor 14 to provide electrical communication therewith.

The area covered by both the electrically-insulating adhesive 48 and the electrically-conducting adhesive 48 may be substantially similar to the total area of the substrate 32, as shown in FIG. 2. However, individual coverage of each adhesive may vary. For instance, the electrically-conductive adhesive 48 may extend over a first area of the substrate 32, and the electrically-insulating adhesive 48 may extend over a second area of the substrate, where the second area is greater than (e.g. by 10% or more), smaller than (e.g. by 10% or more), or substantially the same as, the first area.

For instance, in one embodiment shown in FIG. 4, the electrically-conductive adhesive 48 may cover an area at the distal end 50 of the adhesive connector 18 that corresponds to a portion of the metal strip 26. The specific coverage may vary, depending on a desired contact resistance between the metal strip 26 and the electrically-conductive adhesive 48, as well as other factors. Also, for improved adhesion, the electrically-insulating adhesive 44 may be patterned to extend a full length of the adhesive connector 18 along the midline 36 on either side of the electrically-conductive adhesive 48, as shown.

Referring to FIG. 5, in a different embodiment, a single adhesive connector 18' may provide electrical connection to two different conductors arranged in close proximity to one another, such as two printed conductors 12 or bus conductors 14. For instance, in some applications, the conductors may receive different voltages or voltage polarities. As such, the adhesive connector 18' includes two conductive strips 34a, 34b, along with corresponding metal strips 26a, 26b positioned at the distal end 46 of the adhesive connector 18'. Although not shown, each of the conductive strips 34a, 34b is connected to the corresponding metal strips 26a, 26b using conductive staples, as described. Each conductive strip 34a, 34b is partially covered with a patch of electrically-conductive adhesive 48 for providing electrical contact. The other portions of the conductive strips 34a, 34b are covered with electrically-insulating adhesive 44 for providing adhesion to the glass surface 28. In some configurations, the area covered by electrically-insulating adhesive 48 is maximized to enhance adhesion. In addition, an insulating region 52 is formed between the patches covered by the electrically-conducting adhesive 48 in order to prevent shorting between the conductors, as shown.

Referring now to FIG. 6, an alternative version of the embodiment of FIG. 5 is shown, which provides for simplified manufacturing and alignment between the conductive strips 34a, 34b and the conductors. In this embodiment, the two patches of electrically-conductive adhesive 48 in FIG. 5 are replaced with an anisotropic electrically-conductive adhesive 54, which conducts electricity primarily in a direction that is perpendicular to the plane defined by the substrate 32 of the adhesive connector 18'. In this manner, the single application of the electrically-conductive adhesive 54 covering both conductive strips 34a, 34b may be used without risk for shorting between them.

It may be appreciated that the flexible nature of the adhesive connector 18, and variations as described, allows for good adhesion and close contact to curved surfaces, such as the glass surface 28 of the window 10 in FIG. 1. In particular, the adhesive connector 18 provides ample area for strain relief, allowing secure adhesion to the glass surface 28 outside of the region of the bus conductor 14. Such strain relief minimizes the risk that forces on the adhesive connector 18 will delaminate the bus conductor 14, as could occur if the bus conductor 14 provided the only area of adhesion between the adhesive connector 18 and the glass surface 28.

Further, it will also be appreciated that by providing an adhesive connector 18 that can be applied at low temperatures, e.g. below soldering temperatures, material melting temperatures, material phase change temperatures, and others, to the bus conductors 14 without the need for soldering, micro-cracking and other potential damage to the glass surface 28 is avoided.

Although the herein described adhesive connector 18 may be advantageously utilized to make an electrical connection between a wire 16 and a bus conductor 14 on a glass surface 28, as described, it may be appreciated that a variety of other applications are possible. Specifically, the adhesive connector 18 may be used to make secure electrical connections to various conductors formed on support surfaces. For instance, the conductors may be formed on the support surfaces using printing, as well as other deposition techniques, e.g. evaporation, sputtering, epitaxy, electron beam, and so on. Moreover, the support surfaces may include various insulating or non-conductive materials, including silicon, silicon dioxide, aluminum oxide, sapphire, and others known in the art. As explained, the herein described adhesive connector 18 may be particularly advantageous when forming an electrical connection to conductors on a support surface, wherein the conductor and/or support surface is heat sensitive, for instance, due to geometrical dimensions, material properties, and other factors.

The adhesive connectors 18, 18' shown in FIGS. 1-6 are described as being configured to provide an electrical connection to one or more bus conductors 14 on the glass surface 28. However, it may be appreciated that the shape and dimensions of the adhesive connectors 18, 18' may vary depending on the particular application. For instance, in some applications, the adhesive connector 18 may provide an electrical connection to a conductor that is non-linear, e.g. curved. As such, the adhesive connector 18 may be adapted to conform to the geometry of the conductor. Moreover, the adhesive connector 18' may be adapted to provide electrical contact with more than two conductors.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference, which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

Various features of the invention are set forth in the following claims. It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention.

All of the publications described herein, including patents and non-patent publications are hereby incorporated herein by reference in their entireties.

We claim:

1. An adhesive connector for making an electrical connection to a conductor formed on a support surface, the adhesive connector comprising:
   a substrate;
   a metal strip attached to a first surface of the substrate, wherein the metal strip is configured to engage a releasable electrical connector;
   a conductive strip attached to a second surface of the substrate;
   a conductive staple configured to secure the conductive strip, the substrate, and the metal strip together; and
   an electrically-conducting adhesive that coats a first portion of the conductive strip, and is configured to provide electrical contact to a conductor formed on a support surface,
   wherein the conductive staple comprises a flat head and prongs, wherein the flat head abuts and electrically communicates with a surface of the conductive strip, and the prongs extend through the conductive strip, the substrate, and into holes of the metal strip.

2. The adhesive connector of claim 1, wherein the substrate is constructed using a flexible polymer.

3. The adhesive connector of claim 1, wherein the metal strip further comprises:
   a first portion that is configured to attach to, and lie coplanar with, the first surface of the substrate, and
   a second portion that is canted away from first surface of the substrate, and configured to engage the releasable electrical connector.

4. The adhesive connector of claim 1, wherein the conductive strip is constructed using laminated foil or printed conductive ink.

5. The adhesive connector of claim 1, wherein a width of the conductive strip is substantially the same or greater than the width of the conductor.

6. The adhesive connector of claim 5, wherein the width of the conductive strip is greater than the width of the conductor by approximately between 10% to 20%.

7. The adhesive connector of claim 1, wherein the conductive strip is positioned along a midline of the substrate that extends along a long dimension of the substrate.

8. The adhesive connector of claim 1 further comprising a heat sink positioned between the first surface of the substrate and the metal strip.

9. The adhesive connector of claim 1 further comprising an electrically-insulating adhesive that coats a second portion of the conductive strip.

10. The adhesive connector of claim 9, wherein the electrically-conductive adhesive extends over a first area of the second surface of the substrate, and the electrically-insulating adhesive extends over a second area of the second surface of the substrate.

11. The adhesive connector of claim 1, wherein an area of the substrate is sufficient to relieve a strain on the conductor formed on the support surface.

12. The adhesive connector of claim 1 further comprising a second conductive strip attached to the second surface of the substrate, and a second metal strip attached to the first surface of the substrate, to electrically connect a second conductor formed on a support surface to a second releasable electrical connector.

13. The adhesive connector of claim 12, wherein the electrically-conducting adhesive coats a portion of the second conductive strip.

14. The adhesive connector of claim 13, wherein the electrically-conducting adhesive is an anisotropic electrically-conducting adhesive configured to conduct electricity in a direction that is perpendicular to a plane defined by the second surface of the substrate.

15. The adhesive connector of claim 1 further comprising a release liner covering the electrically-conducting adhesive.

16. An adhesive connector for making an electrical connection to a printed conductor formed on a glass surface, the adhesive connector comprising:
   a flexible substrate configured to conform to a glass surface;
   a metal strip attached to a first surface of the flexible substrate, wherein the metal strip is configured to engage a releasable electrical connector;
   a conductive strip attached to a second surface of the flexible substrate;
   a conductive staple configured to secure the conductive strip, the flexible substrate, and the metal strip together; and
   an electrically-conducting adhesive that coats a first portion of the conductive strip, and is configured to provide electrical contact to a printed conductor formed on the glass surface,
   wherein the conductive staple comprises a flat head and prongs, wherein the flat head abuts and electrically communicates with a surface of the conductive strip, and the prongs extend through the conductive strip, the substrate, and into holes of the metal strip.

17. The adhesive connector of claim 16, wherein the printed conductor forms a heater.

18. The adhesive connector of claim 16 further comprising a heat sink positioned between the first surface of the flexible substrate and the metal strip.

19. The adhesive connector of claim 16 further comprising an electrically-insulating adhesive that coats a second portion of the conductive strip.

* * * * *